US010118303B2

(12) United States Patent
Van Der Borst et al.

(10) Patent No.: US 10,118,303 B2
(45) **Date of Patent: *Nov. 6, 2018**

(54) ROTARY SHAVERS, WITH IMPROVED DRIVE AND SUPPORT STRUCTURE FOR THE SHAVING HEADS

(71) Applicant: KONINKLIJKE PHILIPS N.V., Eindhoven (NL)

(72) Inventors: Albertus J. C. Van Der Borst, Drachten (NL); Bart J. Massee, Kirkland, WA (US); Paul A. J. Ackermans, Nuenen (NL); Wilko Westerhof, Drachten (NL); Albert J. Aitink, Drachten (NL); Ype Brada, Leeuwarden (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 3 days.

This patent is subject to a terminal disclaimer.

(21) Appl. No.: 15/480,716

(22) Filed: Apr. 6, 2017

(65) Prior Publication Data

US 2017/0210019 A1 Jul. 27, 2017

Related U.S. Application Data

(63) Continuation of application No. 14/499,338, filed on Sep. 29, 2014, now Pat. No. 9,616,583, which is a (Continued)

(30) Foreign Application Priority Data

Dec. 22, 2004 (EP) .................................... 04106853

(51) Int. Cl.
*B26B 19/14* (2006.01)
*B26B 19/28* (2006.01)
*B26B 19/38* (2006.01)

(52) U.S. Cl.
CPC .............. *B26B 19/28* (2013.01); *B26B 19/14* (2013.01); *B26B 19/143* (2013.01); (Continued)

(58) Field of Classification Search
CPC ..... B26B 19/386; B26B 19/28; B26B 19/143; B26B 19/14; B26B 19/145
(Continued)

(56) References Cited

U.S. PATENT DOCUMENTS 228,153 A 5/1880 Willcoxson
635,400 A 10/1899 Schwab
(Continued)

FOREIGN PATENT DOCUMENTS

EP 0318103 5/1989
EP 1175972 A2 1/2001
(Continued)

*Primary Examiner* — Omar Flores Sanchez

(57) ABSTRACT

The invention relates to a shaver, comprising a handle, at least two rotary shaving heads, driven by at least one drive shaft which protrudes from said handle, and a support structure for supporting said shaving heads onto the handle so as to have their joined shaving surface (S) extend substantially perpendicular to said at least one drive shaft. The support structure is configured such, that a space (A), restricted at one side by the shaving heads and at the opposite side by the handle, is substantially open to its remaining, surrounding side.

30 Claims, 7 Drawing Sheets

Figure 1A:
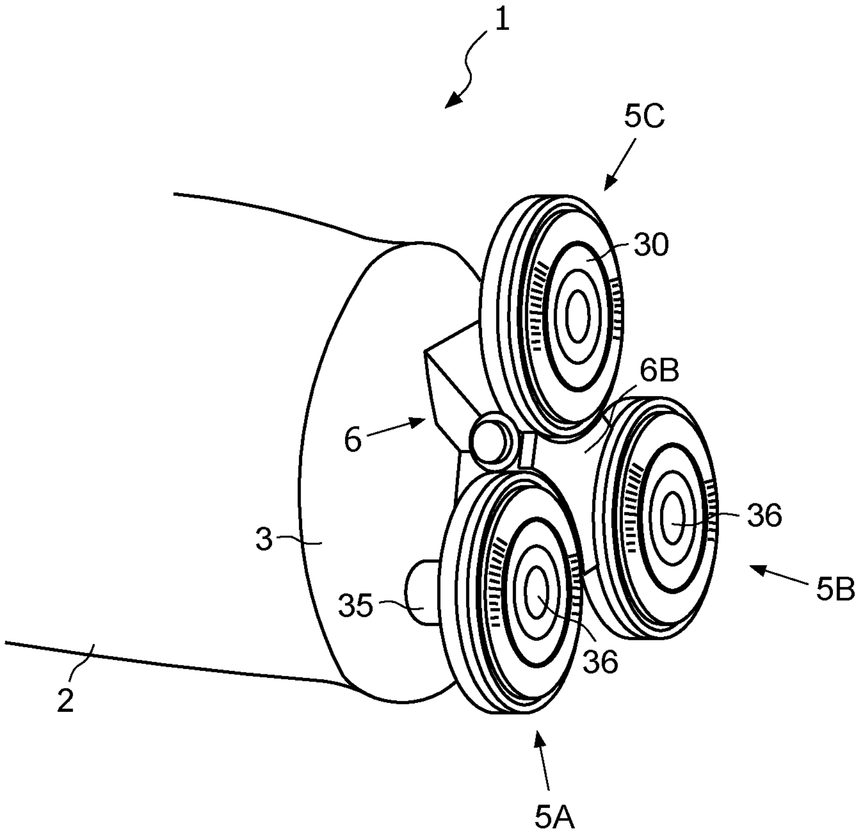

Related U.S. Application Data continuation of application No. 11/722,486, filed as application No. PCT/IB2005/054278 on Dec. 16, 2005, now Pat. No. 8,844,141.

(52) U.S. Cl.
CPC .......... *B26B 19/145* (2013.01); *B26B 19/386* (2013.01); *H05K 999/99* (2013.01)

(58) Field of Classification Search
USPC ................................. 30/43.4–43.6, 538, 527
See application file for complete search history.

(56) References Cited

U.S. PATENT DOCUMENTS

| | | | |
|---|---|---|---|
| 672,203 | A | 4/1901 | Brew |
| 2,280,052 | A | 4/1942 | Bahr |
| 2,632,948 | A | 3/1953 | Hermann |
| 2,952,908 | A | 9/1960 | Gerrit et al. |
| 3,061,925 | A | 11/1962 | Vaes |
| 3,125,807 | A | 3/1964 | Bayard |
| 3,220,109 | A | 11/1965 | Haan |
| 3,369,294 | A | 2/1968 | Shaw et al. |
| 3,656,235 | A | 4/1972 | Zuurveen |
| 3,797,109 | A | 3/1974 | Yamada et al. |
| 4,031,618 | A | 6/1977 | Mansfield |
| 4,688,329 | A | 8/1987 | Oord |
| 5,007,168 | A | 4/1991 | Messinger et al. |
| 5,031,315 | A | 7/1991 | Labrijn |
| 5,233,746 | A | 8/1993 | Heintke |
| 5,313,704 | A | 5/1994 | Atsumi et al. |
| 6,301,792 | B1 | 10/2001 | Speer |
| 6,584,691 | B1 | 7/2003 | Gerasimov et al. |
| 7,020,966 | B2 | 4/2006 | Shiba et al. |
| 7,503,118 | B2 | 3/2009 | Oh |
| 7,930,828 | B2 | 4/2011 | Brada et al. |
| 8,296,954 | B2 | 10/2012 | Schneider |
| 8,393,082 | B2 | 3/2013 | Shimizu |
| 8,844,141 | B2 | 9/2014 | Vander Borst |
| 2004/0237308 | A1 | 12/2004 | Mitchell et al. |
| 2008/0276459 | A1 | 11/2008 | De Wit |

FOREIGN PATENT DOCUMENTS

| | | |
|---|---|---|
| FR | 1513088 B | 3/1967 |
| FR | 2613975 | 10/1988 |
| JP | 3924334 | 6/2007 |

ROTARY SHAVERS, WITH IMPROVED DRIVE AND SUPPORT STRUCTURE FOR THE SHAVING HEADS

This application claims the benefit or priority of and describes relationships between the following applications: wherein this application is a continuation of U.S. patent application Ser. No. 14/499,338, filed Sep. 29, 2014, which is a continuation of U.S. patent application Ser. No. 11/722,486, filed Oct. 2, 2009, which is the National Stage of International Application No. PCT/IB2005/054278, filed Dec. 16, 2005, which claims the priority of foreign application 04106853.7 filed Dec. 22, 2004, all of which are incorporated herein in whole by reference.

The invention relates to a shaver comprising a handle, at least two rotary shaving heads, driven by at least one drive shaft that protrudes from said handle, and a support structure for supporting the shaving heads onto said handle so as to have their joined shaving surface extend substantially perpendicular to said at least one drive shaft.

Such shavers are known. Typically, the shaving heads are connected to the handle via a cup-shaped support structure, which together with said handle encloses a chamber for collecting hairs, shaving lotion and other waste materials which during use may enter the shaver via the shaving heads. The chamber may furthermore serve to protect a user and the at least one drive shaft against direct mutual contact.

A disadvantage of this known shaver is that, in order to clean the chamber and/or shaving heads, one or more parts of the shaver need to be removed to render the chamber and/or shaving heads accessible for cleaning. This imposes special requirements on the construction of said removable parts, which may increase the complexity and/or vulnerability of the shaver. Moreover, it requires a user to perform an additional handling, each time he desires to clean the shaver. Also, the chamber may be difficult to clean, especially around the or each drive shaft and other, narrow corners.

It is therefore an object of the invention to provide a shaver of the above-described type, wherein the disadvantages of the known shavers are avoided, while maintaining the advantages thereof. To that end, a shaver according to the invention is characterised in that the support structure which connects the shaving heads to the handle is configured such that the space, sandwiched between the shaving heads and the handle is substantially open to its other, surrounding sides.

By doing so, the shaving heads will more or less float at a distance from the handle, only connected thereto via the at least one drive shaft and the support structure. Thanks to the absence of an enclosed chamber, few hairs, shaving lotion and the like contamination will collect in said space between the shaving heads and the handle. Most of these waste products will immediately leave the shaver via the open side. Therefore, little cleaning is required. Moreover, when cleaning is needed, the shaving heads will be readily accessible, without having to remove or detach any shaver part, thanks to the open support structure. The shaver can be readily rinsed or immersed in water.

In this description, the term ‘substantially open’ means that the space between the shaving heads and the handle is not enclosed in any way by the support structure. The support structure at most supports said shaving heads at a few, isolated points, for instance spaced along their circumference or centrally, between said shaving heads. When located along the circumference, the support structure may for instance be dimensioned such, that at least 80% of an imaginary surface, passing through the circumference of the shaving heads and that of the handle, remains open.

Furthermore the wording regarding the joined shaving surface of the shaving heads extending ‘substantially perpendicular’ to the at least one drive shaft of said heads, is to be understood to cover embodiments wherein said shaving surface has a slightly curved, convex or concave configuration and/or situations, during use, wherein one or more shaving heads has a temporarily pivoted or tilted position, for contour following purposes.

In further elaboration the support structure is preferably designed such that said space between the shaving heads and the handle is substantially free from obstacles, other than the at least one drive shaft, the support structure, and possibly, one or more conduits of a lotion supply system. This too will prevent waste products from accumulating within said space, requiring less cleaning action. Moreover, such free space makes the shaving heads even more readily accessible for cleaning.

Preferably, the support structure and the at least one drive shaft are configured such that the shaving heads are visible during use, or at least the part thereof that defines the contour of the shaving surface. Thanks to such visual information, a user may even better control his shaving manoeuvres, enabling him to accurately follow a hair line, for instance when trimming a beard or moustache.

In a further preferred embodiment, the shaving heads may be driven by a single drive shaft. Such shaft requires little space and thus enables the open space between the shaving heads and the handle to be maximized. Moreover, if the handle is to be watertight, for instance to protect the motor and possible other drive means enclosed therein, only one seal is needed to guide the drive shaft through said handle. This will minimize friction and energy consumption, usually associated with such seals.

In an alternative preferred embodiment, each shaving head may be driven by an individual drive shaft, which may be disposed centrally or eccentrically with regard to the respective shaving head. In the first case, the drive shaft may resiliently support said shaving head, resulting in good contour following behaviour. Moreover, no transmission means are needed between the drive shafts and the shaving heads, so that the shaving heads can have minimum dimensions, and all transmission means can be accommodated in the handle, well protected against external influences. In case of an eccentrically positioned drive shaft, such shaft may be positioned anywhere along the shaving head's circumference, which offers a large design freedom for said shaving head.

In further elaboration, the or each drive shaft may be at least partly enclosed by the support structure. This results in a compact drive-support structure, for maximum openness below the shaving heads. The support structure may furthermore protect the shaft, for instance against contamination and direct contact with a user.

In further elaboration, the shaving heads may be provided with a central through opening, for increased openness and accessibility of the shaving heads, and enhanced visibility of the shaving actions, during use.

Further advantageous embodiments of a shaver according to the present invention are set forth in the dependent claims.

Figure 1B:
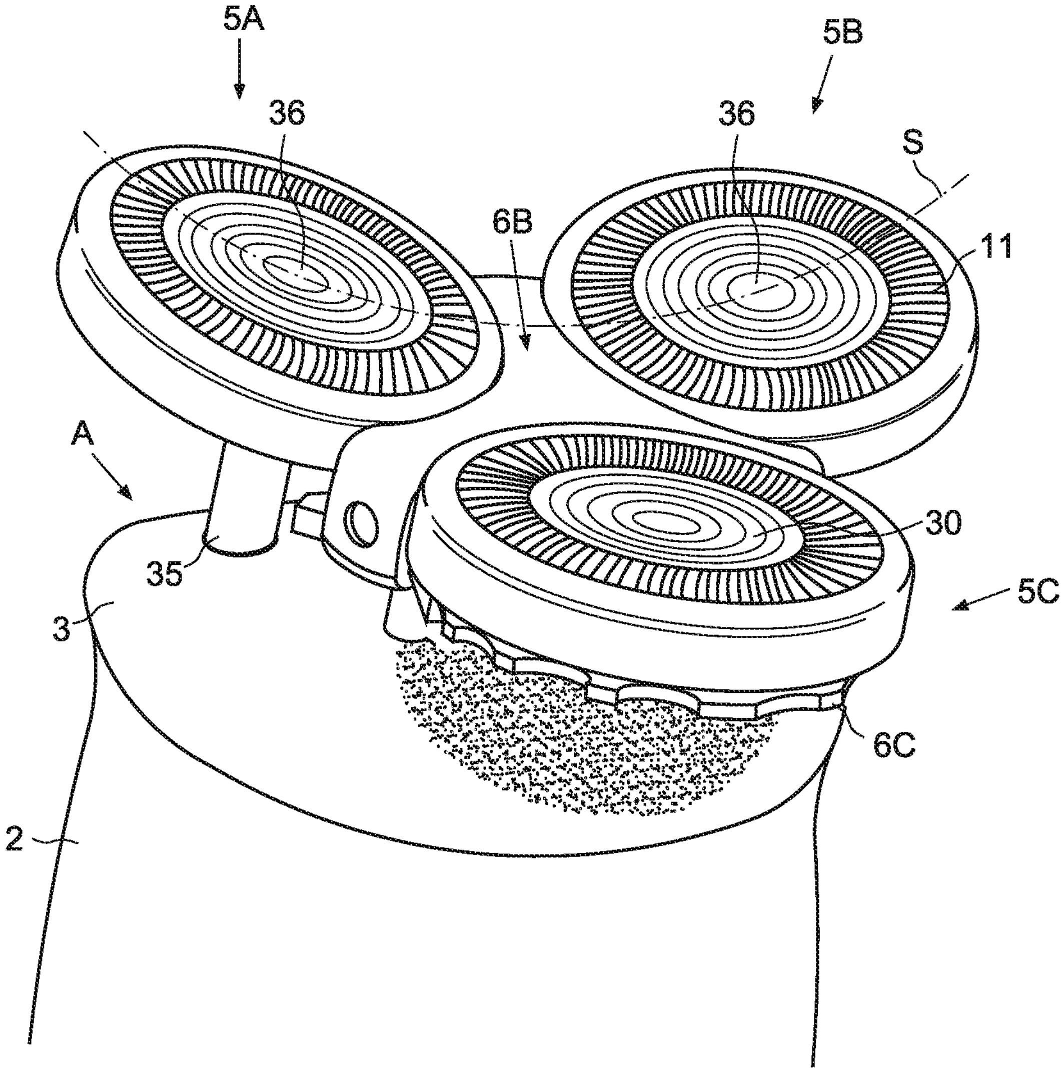
Figure 1C:
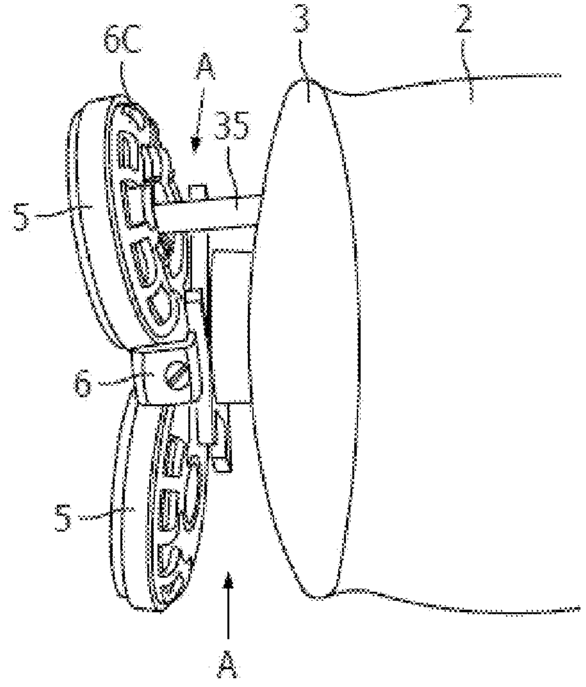
Figure 1D:
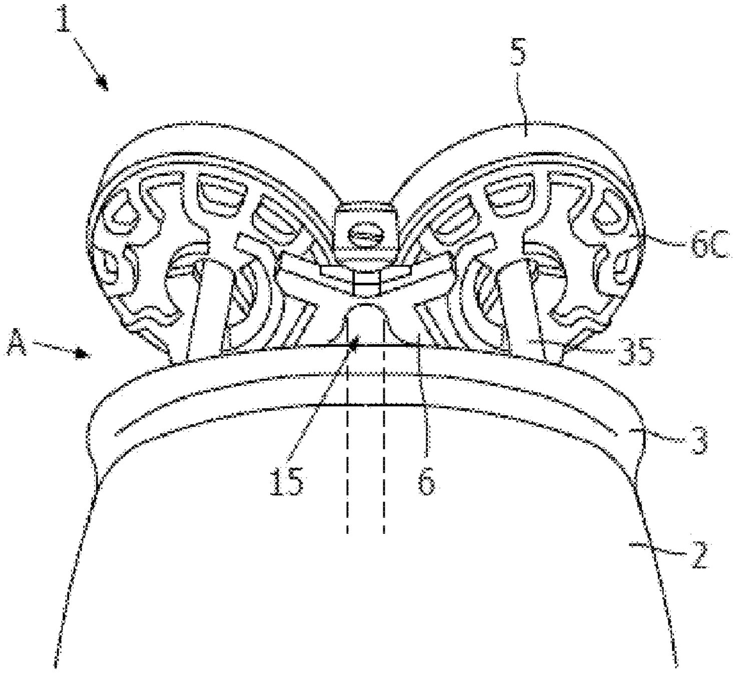
Figure 2A:
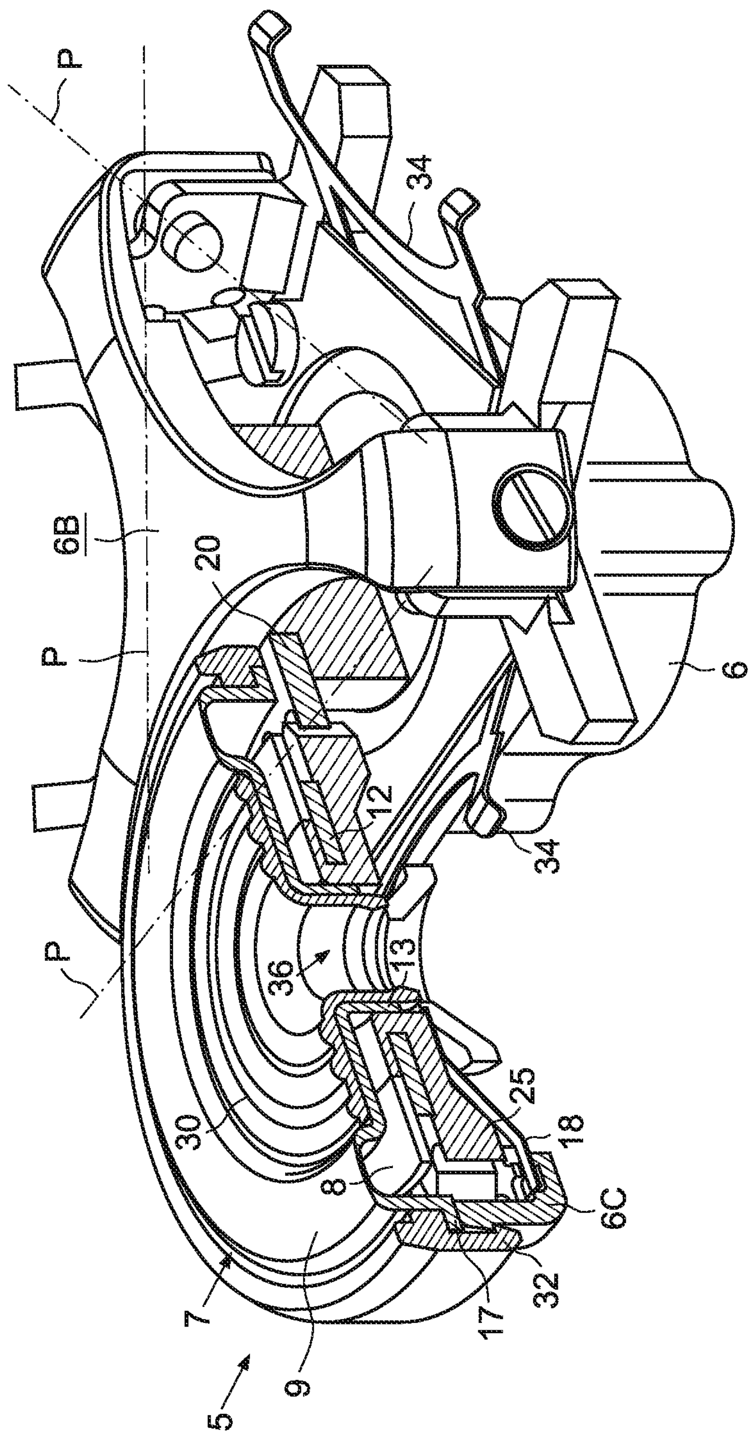
Figure 3A:
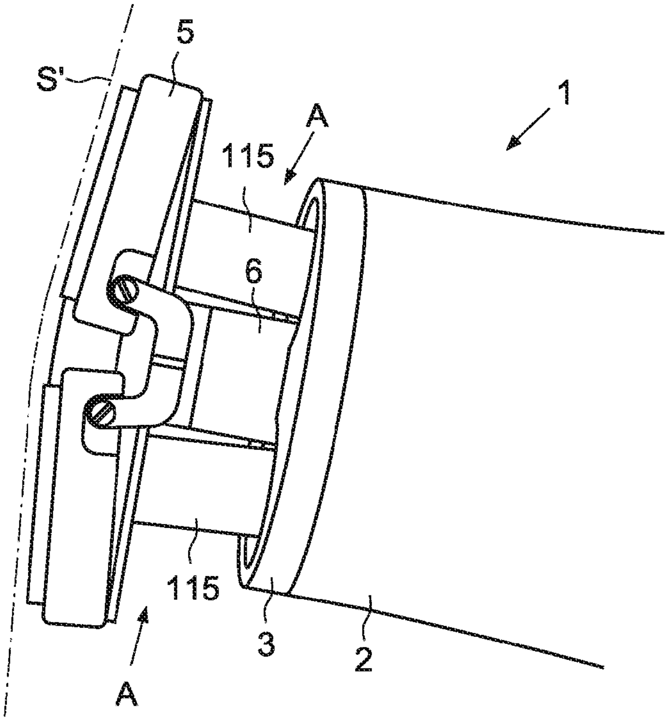
Figure 3B:
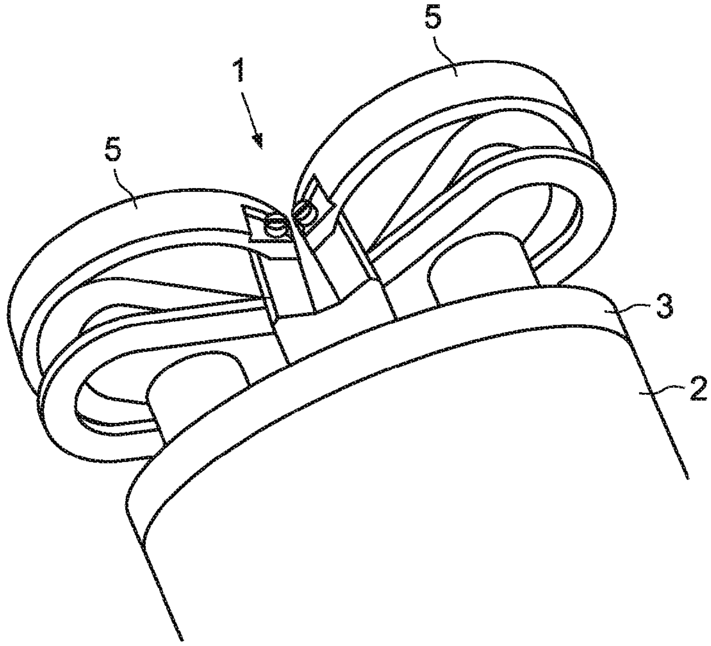
Figure 4:
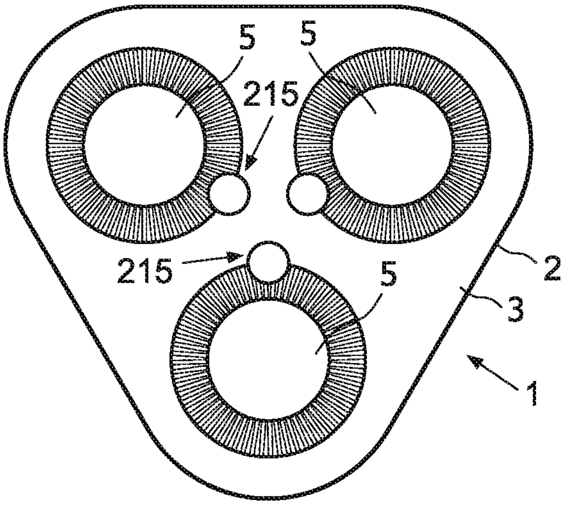

To explain the invention, exemplary embodiments thereof will hereinafter be described with reference to the accompanying drawings, wherein:

FIGS. 1A-D show a shaver according to the invention, with a single drive shaft and a central support structure, in perspective view, from four different angles;

FIG. 2A,B show in more detail the drive and support structure of the shaver of FIG. 1, in cross sectional view;

FIG. 3A,B show an alternative embodiment of a shaver according to the invention, wherein the shaving heads are driven by individual drive shafts; and FIG. 4 shows schematically an alternative embodiment of a shaver according to the invention, wherein the shaving heads are driven by individual, eccentric located drive shafts.

In this description, identical or corresponding parts have identical or corresponding reference numerals.

FIGS. 1A-D show, from different angles, a shaver 1 according to the invention, comprising a handle 2 and three rotary shaving heads 5, connected to said handle 2 in a triangular formation. The shaving heads 5 are driven by a single drive shaft 15, which in turn is driven by a motor, accommodated in the handle 2, possibly together with suitable transmission and/or reduction means (not visible in FIGS. 1A-D). In the present embodiment the drive shaft 15 is positioned centrally with respect to the shaving heads 5 and surrounded by a central support structure 6. The shaving heads 5 are pivotally connected to said central support structure 6, in such way that a space A below said shaving heads 5, is substantially open to the surroundings and substantially free from obstacles, as best seen in FIG. 1C. Thanks to such open design, the shaver 1 and shaving heads 5 are readily accessible and easy to clean, without first having to open or remove a shaver part. Moreover, during use, a large portion of the bottom side of the shaving heads 5 will be visible, as best seen from FIG. 1C, D, allowing a user to monitor and accurately control his shaving manoeuvres, for instance when following a hairline of a beard or moustache.

In the embodiment of FIG. 1, the open space A is interrupted by two conduits 35, belonging to a shaving lotion supply system. Such system may further comprise a reservoir and a pump, which may be integrated in or mounted on the handle 2 (not shown). The conduits 35 run from such reservoir to an outlet nozzle 36, positioned near or in the shaving heads 5. In the present example, only two of the three shaving heads 5A,B are provided with such nozzle 36. The third shaving head 5C is the shaving head that during use will be closest to a user's mouth and therefore, for obvious reasons, construed without such nozzle 36. Of course, in an alternative embodiment, the supply conduits 35 may be integrated in or at least extend through the support structure 6, so as to maximise the open space A. Also, instead of multiple nozzles 36, a single nozzle may be provided, disposed strategically in or near the shaving surface S.

As best seen from FIG. 2A,B, each shaving head 5 comprises a substantially cap-shaped external cutter member 7, including an annular running groove 9 with hair entry apertures 11. The shaving head 5 furthermore comprises an internal cutter member 8, including a base plate 12 with cutters 14, arranged to rotate along said running groove 9, thereby cutting off hairs entering said hair-entry apertures 11. The external cutter members 7 at their bottom side are provided with a circumferential flange 17 and a central tube 13. The flange 17 serves to clamp the external cutter member 7 onto a substantially ringshaped subholder 6C by means of a clamping ring 32. The tube 13 serves as a bearing to rotatably mount the internal cutter member 8. Spring means 18 are provided, between the subholder 6C and the internal cutter member 8, to bias the internal cutter member 8 against the external member 7, thereby reducing a cutting gap between said members 7, 8.

Figure 2B:
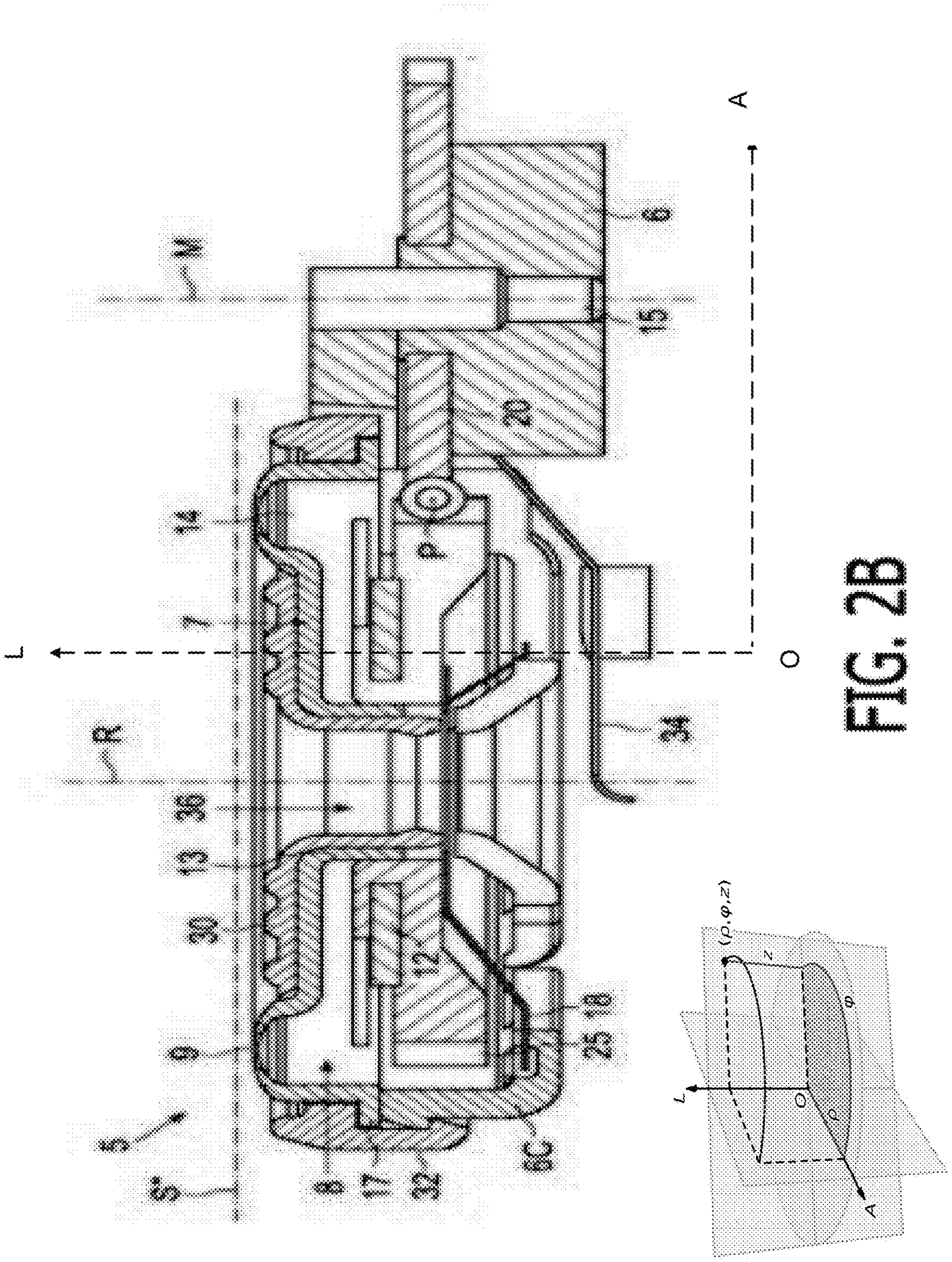

The subholders 6C are each pivotally connected to the central support structure 6, around a pivot axis P. Second spring means 34 are provided, to bias the subholders 6C upward, around their pivot axes P. A central top cover 6B may be provided, to cover the central drive shaft 15 and to limit said upward pivot angle of the heads 5, thereby determining the shape of the shaving surface S in neutral position. Such surface S, S', S" may for instance be concave, as shown in FIG. 1B, convex as shown in FIG. 3A, or straight, as seen in FIG. 2B respectively. Thanks to the pivotal connection of the subholders 6C to the support structure 6, the shaving heads 5 may be pressed downward during use, wherein the spring means 34 will provide a counter force, keeping the heads 5 into contact with a user's skin, thus ensuring good contour following.

For driving the internal cutter members 8, each member 8 is provided with a gear wheel 25 at its bottom side. The drive shaft 15 is provided with a primary gear wheel 20, arranged to engage the respective gear wheels 25 of the internal cutter members 8. It will be clear, that upon rotation of the drive shaft 15, the primary gear wheel 20 will drive the gear wheels 25, thereby rotating the internal cutter members 8 along the external cutter members 7. Thanks to the gear wheel 25 being directly fastened to the internal cutter member 8, i.e. without intermediate components, the height of the shaving heads 5 can be minimised. Of course, additional gear wheels may be provided, for instance to reverse a rotation direction of one or more of the shaving heads 5 and/or to change the rotation speed. Also, it is possible to have the drive shaft 15 drive one of the shaving heads 5 directly, and the other shaving heads 5 indirectly via an appropriate gear wheel train. In that case, the drive shaft 15 and support structure 6 may have an eccentric position, for instance adjacent a circumferential edge of the shaving surface S. Also, the rotation axes M and R or the respective gear wheels 20, 25 may include an angle, for instance to allow the shaving heads 5 to adjust their orientation to the curvature of a user's skin.

Preferably, the end side 3 of the handle 2 that faces the shaving heads 5 is construed watertight, so as to prevent water, shaving lotion and the like to penetrate said handle 2 during shaving and cleaning of the shaver 1. To maintain the handle 2 watertight, the drive shaft 15 may be provided with a seal 22 where it passes said end side 3.

It will be appreciated that in the above described embodiment, the space A between the shaving heads 5 and the handle 2 can be maximally open, thanks to the single drive shaft 15. Thanks to such openness, the shaving heads 5 will be maximally visible, during use, and maximally accessible during cleaning, without a user needing to perform any special handling to render said shaving heads 5 accessible for cleaning. Moreover, only one seal 22 is needed to maintain the handle 2, or at least the end side 3 thereof, watertight.

In an alternative embodiment, each shaving head 5 may be driven by an individual drive shaft 115, as illustrated in FIG. 3A,B, wherein the drive shafts 115 are driven by a motor and suitable transmission means, accommodated in the handle 2, and wherein each drive shaft 115 passes the end surface 3 of the handle via suitable seals 22. The configuration of the shaving heads 5 and the way in which these heads 5 are mounted to a central support structure 6 is similar as described with reference to FIGS. 1 and 2, with the exception that in the present embodiment the shaving heads 5, in their neutral position, define a convex shaving surface S'.

Although the individual drive shafts 115 of the shaving heads 5 occupy more space and require more seals 22 than the single drive shaft 15 of the shaver according to FIGS. 1 and 2, the use of individual drive shafts 215 may offer some advantages. For instance, thanks to such individual drive shafts 215 the shaving heads 5 can be mounted with a considerable amount of freedom, allowing the heads 5 to move independently of each other in axial direction and/or to tilt around any arbitrary axis extending in a plane substantially perpendicular to the rotation axis R of the respective heads 5. Such freedom provides the shaver 1 with good contour following properties. The driving ends of the shafts 215 (not shown) can for instance be configured as shown and described in the international application WO03/011537 of applicant, in particular in FIG. 7 and accompanying description, the subject matter of which is considered to be incorporated herein by reference.

Furthermore, thanks to the individual drive shafts 115, the internal cutter members 8 may be configured without gear wheels 25, enabling the total height of the shaving heads 5 to be even further reduced. All gear wheels 20, 25 can be accommodated in the handle 2, where they are well protected against potential harmful external influences, such as hairs, shaving lotion and direct contact with a user.

In FIG. 4A,B a further alternative embodiment is shown, combining the aforementioned drive configurations. In this embodiment, the shaving heads 5 are driven by individual drive shafts 215, which in turn are driven by a motor and suitable transmission means, accommodated in the handle 2, in a similar way as described in FIG. 3A,B. However, in contrast to the embodiment of FIG. 3A,B, the drive shafts 215 do not extend centrally relative to the shaving heads 5, but eccentrically, near a common centre thereof (see FIG. 4). To drive the internal cutter members 8, the eccentric drive shafts 215 may be each provided with a pinion wheel 20, engaging a gear wheel 25 which may be fastened to the internal cutter members 8, as shown in FIG. 2A,B. The shaving heads 5 may be supported via a central support structure (not shown), like the one disclosed in the previous embodiments. Alternatively, the shaving heads 215 may be supported by decentralized support structures, which may for instance surround the respective drive shafts 215 or extend near a circumference of the shaving surface S. Also, the drive shafts 215 may be located at other points along the periphery of the shaving heads, for instance near the corners of the substantially triangular shaving surface S. In such case, the transmission means may for instance comprise a belt, chord or other suitable means for transferring the driving motion of the motor onto the shafts.

Although in comparison to the embodiment of FIG. 3A,B, the embodiment of FIG. 4A,B may require additional transmission means (in particular pinion wheels 20 and gear wheels 25), this may be worthwhile, thanks to the additional design freedom it offers. Indeed, thanks to the eccentric positioning of the drive shafts 215, the shaving heads 5 may be designed more freely, without having to bother about or having to reserve space for said drive shafts 215. The shaving heads 5 may for instance be designed to have different diameters (within one shaver 1) and/or be arranged differently, for instance in a non-equilateral triangle or any other, desirable formation.

In all illustrated examples, the shaving heads 5 may be provided with a cover plate 30, as best seen in FIGS. 1A,B and 2A,B. These cover plates 30 may for instance serve aesthetic purposes and/or feature information, regarding for instance the type of shaver and/or the manufacturer. Alternatively or additionally, said cover plates 30 may include aforementioned outlet nozzle 36, for providing the shaving surface S with shaving lotion of foam. In such case, the cover plates 30 may be designed to enhance the distribution of said shaving lotion or foam over the shaving surface S. In an alternative embodiment, the cover plates 30 may be omitted. In such case, the diameter of the central tube 13 of the external cutter member 7, may be increased so as to extend up to the running groove 9. The central opening in the internal cutter member 8 may be adapted accordingly. With such adaptations, the shaving heads 5 will be substantially open, which even further increases the openness of the shaver 1 and the visibility of the shaving heads 5.

Optionally, in all embodiments, the shaving heads 5 may be detachably coupled to the or each drive shaft 15, 115, 215, allowing said heads 5 to be decoupled from the shaving body 2, each separately or all together, as one shaving unit. Such decoupling provision may for instance be used for cleaning or reparation purposes. It also allows the shaving body 2 to be used with different sets of shaving heads 5, for instance of different size or with different hair entry openings, or for different shaving conditions (dry, wet), etc. The decoupling provision may furthermore serves as a sort of safety provision, which can prevent serious damage to the shaving heads 5 and/or the drive means, by allowing the shaving heads 5 to decouple upon large external forces and/or shocks, such as for instance encountered when the shaver is accidentally dropped.

The invention is not in any way limited to the exemplary embodiments presented in the description and drawing. All combinations (of parts) of the embodiments shown and described in this description are explicitly understood to be incorporated within this description and are explicitly understood to fall within the scope of the invention. Moreover, many variations are possible within the scope of the invention, as outlined by the claims.

The claimed invention is:

1. A shaver comprising:

a handle, at least two rotary shaving heads, driven by at least one drive shaft which protrudes from said handle, and a central support structure adapted to support the at least two rotary shaving heads onto said handle, so as to have their joined shaving surface extend substantially perpendicular to said at least one drive shaft, wherein the central support structure is configured to limit an upward pivot angle of the at least two rotary shaving heads to enable a concave, convex, or straight shape of the shaving surface in a neutral position, wherein the central support structure is further adapted such that a space, restricted at one side by the at least two rotary shaving heads and at its opposite side by the handle, is substantially open to its remaining, surrounding side, wherein the support structure supports the at least two rotary shaving heads at a fixed number of isolated points spaced centrally between the at least two rotary shaving heads, wherein the at least one drive shaft is positioned centrally with respect to the at least two rotary shaving heads and surrounded by the central support structure, and wherein the at least one drive shaft is at least partially enclosed by the central support structure.

2. The shaver according to claim 1, wherein the support structure is configured in such way that said space is substantially free from obstacles, apart from said support structure, the at least one drive shaft and one or more supply conduits for supplying the at least two rotary shaving heads with shaving lotion.

3. The shaver according to claim 1 wherein the handle and the support structure are designed such that, during shaving, at least part of each of the at least two rotary shaving heads is visible.

4. The shaver according to claim 1, wherein the support structure extends centrally with respect to the at least two rotary shaving heads.

5. The shaver according to claim 1, wherein the at least two rotary shaving heads are driven by a single drive shaft.

6. The shaver according to claim 1, comprising three rotary shaving heads, positioned in a triangular formation, wherein the support structure substantially extends within a space, enclosed by a cylinder passing through the rotation axes of adjacent rotary shaving heads.

7. The shaver according to claim 1, wherein the at least two rotary shaving heads are pivotally connected to the support structure.

8. The shaver according to claim 1, wherein the at least two rotary shaving heads are resiliently connected to the support structure via spring means to provide a counter force to a user's downward pressure to ensure proper contour following.

9. The shaver according to claim 1, wherein each of said at least two rotary shaving heads comprise an external cutter member with an annular running groove and an internal cutter member with a series of cutters, arranged to be rotated along said running groove, and wherein each of said at least two rotary shaving heads further comprise a central opening, extending through the external and internal cutter members.

10. The shaver according to claim 9, wherein the internal cutter member is provided with a gear wheel at a bottom side.

11. The shaver according to claim 9, wherein each external cutter member is a substantially cap-shaped external cutter member, and wherein the annular running groove of each external cutter member includes a plurality of hair entry apertures.

12. The shaver according to claim 9, wherein each internal cutter member further comprises a base plate with a plurality of cutters arranged to rotate along an annular running groove.

13. The shaver according to claim 9, wherein the external cutter member at a bottom side is provided with a circumferential flange and a central tube, the flange being adapted to clamp the external cutter member onto a substantially ringshaped subholder by means of a clamping ring.

14. The shaver according to claim 13, wherein the at least two rotary shaving heads further comprises spring means located between the subholder and the internal cutter member to bias the internal cutter member against the external member, thereby reducing a cutting gap between said member.

15. The shaver according to claim 13, wherein the subholder is pivotally connected to said support structure around a pivot axis.

16. The shaver according to claim 1, wherein the shaver further comprises a central top cover to cover the at least one drive shaft.

17. The shaver according to claim 1, wherein the at least two rotary shaving heads are resiliently connected to the at least one drive shaft via spring means to provide a counter force to a user's downward pressure to ensure proper contour following.

18. A shaver comprising:

a handle, at least two rotary shaving heads, each of the at least two rotary shaving heads being respectively driven by a corresponding dedicated drive shaft which protrudes from said handle, and a central support structure configured to support the at least two rotary shaving heads onto said handle, so as to have their joined shaving surface extend substantially perpendicular to each of the corresponding dedicated drive shafts, wherein the corresponding dedicated drive shafts are located eccentrically with respect to a respective corresponding shaving head to be driven, wherein the central support structure is configured to limit an upward pivot angle of the at least two rotary shaving heads to enable a concave, convex, or straight shape of the shaving surface in a neutral position, wherein the central support structure is further configured such that a space, restricted at one side by the at least two rotary shaving heads and at its opposite side by the handle, is substantially open to its remaining, surrounding side, wherein the support structure supports the at least two rotary shaving heads at a fixed number of isolated points spaced centrally between the at least two rotary shaving heads, wherein each of the corresponding dedicated drive shafts are at least partially enclosed by the central support structure.

19. The shaver according to claim 18, comprising three rotary shaving heads, positioned in a triangular formation, wherein the support structure substantially extends within a space, enclosed by a cylinder passing through the rotation axes of adjacent rotary shaving heads.

20. The shaver according to claim 18, wherein the at least two rotary shaving heads are pivotally connected to the support structure.

21. The shaver according to claim 18, wherein the at least two rotary shaving heads are resiliently connected to the support structure via spring means to provide a counter force to a user's downward pressure to ensure proper contour following.

22. The shaver according to claim 18, wherein each of said at least two rotary shaving heads each comprise an external cutter member with an annular running groove and an internal cutter member with a series of cutters, arranged to be rotated along said running groove, and wherein each of said at least two rotary shaving heads further comprise a central opening, extending through the external and internal cutter members.

23. The shaver according to claim 18, wherein the shaver further comprises a central top cover to cover each of the corresponding dedicated drive shafts.

24. The shaver according to claim 18, wherein the at least two rotary shaving heads are resiliently connected to its corresponding dedicated drive shaft via spring means to provide a counter force to a user's downward pressure to ensure proper contour following.

25. A shaver comprising:

a handle, at least two rotary shaving heads, each of the at least two rotary shaving heads being respectively driven by a corresponding dedicated drive shaft which protrudes from said handle, and a central support structure configured to support the at least two rotary shaving heads onto said handle, so as to have their joined shaving surface extend substantially perpendicular to each of the corresponding dedicated drive shafts, wherein the corresponding dedicated drive shafts are located near a common centre of its corresponding respective shaving head, wherein the corresponding dedicated drive shafts are located eccentrically with respect to a respective corresponding shaving head to be driven, wherein the central support structure is configured to limit an upward pivot angle of the at least two rotary shaving heads to enable a concave, convex, or straight shape of the shaving surface in a neutral position, wherein the central support structure is further configured such that a space, restricted at one side by the at least two rotary shaving heads and at its opposite side by the handle, is substantially open to its remaining, surrounding side, wherein the support structure supports the at least two rotary shaving heads at a fixed number of isolated points spaced centrally between the at least two rotary shaving heads, and wherein each of the corresponding dedicated drive shafts are at least partially enclosed by the central support structure.

26. The shaver according to claim 25, comprising three rotary shaving heads, positioned in a triangular formation, wherein the support structure substantially extends within a space, enclosed by a cylinder passing through the rotation axes of adjacent rotary shaving heads.

27. The shaver according to claim 25, wherein the at least two rotary shaving heads are pivotally connected to the support structure.

28. The shaver according to claim 25, wherein the at least two rotary shaving heads are resiliently connected to the support structure via spring means to provide a counter force to a user's downward pressure to ensure proper contour following.

29. The shaver according to claim 25, wherein the shaver further comprises a central top cover to cover each of the corresponding dedicated drive shafts.

30. The shaver according to claim 25, wherein the at least two rotary shaving heads are resiliently connected to its corresponding dedicated drive shaft via spring means to provide a counter force to a user's downward pressure to ensure proper contour following.

* * * * *